(12) United States Patent
Thibado et al.

(10) Patent No.: US 11,545,408 B2
(45) Date of Patent: Jan. 3, 2023

(54) REFLOWABLE GRID ARRAY TO SUPPORT GRID HEATING

(71) Applicant: Intel Corporation, Santa Clara, CA (US)

(72) Inventors: Jonathan W. Thibado, Beaverton, OR (US); Jeffory L. Smalley, East Olympia, WA (US); John C. Gulick, Portland, OR (US); Phi Thanh, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 840 days.

(21) Appl. No.: 16/249,499

(22) Filed: Jan. 16, 2019

(65) Prior Publication Data

US 2020/0229294 A1    Jul. 16, 2020

(51) Int. Cl.
*H01L 23/34* (2006.01)
*H05K 1/02* (2006.01)
(Continued)

(52) U.S. Cl.
CPC ........ *H01L 23/345* (2013.01); *H01L 21/4853* (2013.01); *H01L 21/4882* (2013.01);
(Continued)

(58) Field of Classification Search
CPC ............. H01L 23/345; H01L 23/498; H01L 23/49822; H01L 23/49827; H01L 23/49816; H01L 21/4846; H01L 21/485; H01L 21/4853; H01L 21/486; H01L 21/4882; H01L 21/4875; H01L 2021/60022; H01L 2021/60067–6009; H01L 2021/60097; H01L 23/34; H01L 23/26; H01L 23/367; H01L 23/3675; H01L 2224/81234; H05K 1/0212; H05K 1/0234; H05K 1/0296; H05K 1/167; H05K 3/30;
(Continued)

(56) References Cited

U.S. PATENT DOCUMENTS 5,010,233 A * 4/1991 Henschen ............... H05B 3/12
                                                    219/85.1
5,022,955 A * 6/1991 Chen ...................... B23H 3/00
                                                    216/21
(Continued)

*Primary Examiner* — Scott B Geyer
(74) *Attorney, Agent, or Firm* — Schwabe, Williamson & Wyatt, P.C.

(57) ABSTRACT

Embodiments include a reflowable grid array (RGA) interposer, a semiconductor packaged system, and a method of forming the semiconductor packaged system. The RGA interposer includes a substrate having vias and zones, where the zones have embedded heaters. The heaters may include first traces, second traces, and via filament interconnects. The vias may have a z-height greater than a z-height of the heaters, and each of the zones may have a grid pattern. The RGA interposer may include first and second layers in the substrate, where the first layer includes the first traces, the second layer includes the second traces, and the second layer is over the first layer. The grid pattern may have parallel first traces orthogonal to parallel second traces to form a pattern of squares, where the pattern of squares has the first traces intersect the second traces substantially at right angles.

24 Claims, 6 Drawing Sheets

(51) Int. Cl.
*H01L 23/36* (2006.01)
*H01L 23/498* (2006.01)
*H01L 21/50* (2006.01)
*H01L 21/48* (2006.01)
*H05K 1/18* (2006.01)
*H05K 1/11* (2006.01)

(52) U.S. Cl.
CPC .............. *H01L 21/50* (2013.01); *H01L 23/36* (2013.01); *H01L 23/49816* (2013.01); *H05K 1/0201* (2013.01); *H05K 1/115* (2013.01); *H05K 1/181* (2013.01); *H01L 2224/81234* (2013.01); *H05K 2201/10378* (2013.01); *H05K 2201/10734* (2013.01); *H05K 2203/1115* (2013.01)

(58) Field of Classification Search
CPC .......... H05K 3/301; H05K 3/303; H05K 3/32; H05K 3/34; H05K 3/3436; H05K 3/3494; H05K 2201/10378; H05K 2201/10651; H05K 2201/10704; H05K 2201/10719; H05K 2201/10734; H05K 2201/10962; H05K 2201/10984; H05K 2203/1115
See application file for complete search history.

(56) References Cited

U.S. PATENT DOCUMENTS

| | | | | |
|---|---|---|---|---|
| 5,572,409 A * | 11/1996 | Nathan | ................. | H01L 21/485 257/209 |
| 6,031,729 A * | 2/2000 | Berkely | ............. | H01L 23/5382 361/767 |
| 6,114,674 A * | 9/2000 | Baugh | .................... | H05B 3/265 174/250 |
| 6,396,706 B1 * | 5/2002 | Wohlfarth | ............ | H05K 1/0212 228/180.1 |
| 6,548,790 B1 * | 4/2003 | Trucco | ................. | H05K 3/3485 219/616 |
| 7,474,540 B1 * | 1/2009 | Dang | ................. | H01L 25/0655 174/250 |
| 8,059,424 B2 * | 11/2011 | Glever | ............. | H01L 23/49816 361/767 |
| 9,012,811 B2 * | 4/2015 | White | ...................... | H05B 3/28 219/547 |
| 9,515,003 B1 * | 12/2016 | Fitzgerald | ........... | H01L 23/3677 |
| 2003/0047348 A1 * | 3/2003 | Jessep | ............... | H01L 23/49827 174/250 |
| 2006/0065431 A1 * | 3/2006 | Trucco | ................. | B23K 3/0307 174/250 |
| 2012/0262875 A1 * | 10/2012 | Johnson | .................... | G11C 5/04 361/679.02 |
| 2013/0341783 A1 * | 12/2013 | Alfano | ................. | H01L 23/544 257/734 |
| 2015/0090768 A1 * | 4/2015 | Kuroda | ................. | B23K 1/005 228/46 |
| 2015/0333049 A1 * | 11/2015 | Woychik | ........... | H01L 23/49827 438/107 |
| 2016/0218057 A1 * | 7/2016 | Lee | ........................ | H05K 1/097 |
| 2017/0179067 A1 * | 6/2017 | Aoki | ..................... | H05K 3/3436 |
| 2018/0074118 A1 * | 3/2018 | Worrall | ................. | H01L 23/345 |
| 2018/0350767 A1 * | 12/2018 | Carstens | ............... | H01L 23/345 |
| 2019/0066571 A1 * | 2/2019 | Goward | ............. | G09G 3/3233 |
| 2020/0203256 A1 * | 6/2020 | Neal | ................. | H01L 23/49827 |
| 2020/0205299 A1 * | 6/2020 | Thibado | ............. | H05K 1/181 |
| 2020/0229309 A1 * | 7/2020 | Thibado | ............. | H01L 21/4853 |

\* cited by examiner

REFLOWABLE GRID ARRAY TO SUPPORT GRID HEATING

FIELD

Embodiments relate to packaging semiconductor devices. More particularly, the embodiments relate to semiconductor devices having reflowable grid array (RGA) interposers with heater traces in a grid pattern.

BACKGROUND

For the past several decades, the scaling of features in integrated circuits has been a driving force behind an ever-growing semiconductor industry. Scaling to smaller and smaller features enables increased densities of functional units on the limited real estate of semiconductor devices. For example, shrinking the size of a semiconductor package lends to the fabrication of products with increased capacity, such as reflowable grid array (RGA) packages. The drive for ever-more capacity, however, is not without issue. The necessity to optimize the performance of each device becomes increasingly significant.

The existing technology of RGA packages is typically based on embedded serpentine-like copper traces positioned in a defined area, which generally only covers approximately one-tenth of the area that needs heating. These RGA packages may provide adequate control for heating in general, but are greatly influenced by the overall package size. In addition, theses existing RGA packages are greatly limited by the controller designs that limit the number of zones that can be heated in such packages.

For example, some of the existing solutions of the RGA packages allow heating in the package substrates by ensuring that the zone (or area of coverage) of the packages substrates have an average temperature. One major problem, however, is that these RGA packages do not provide pin-point accuracy when heating, thereby the RGA packages can typically have many thermal variations across the zone which creates inefficiencies in the heating process.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Described herein are semiconductor packaged systems with reflowable grid array (RGA) interposers that have embedded heater traces in one or more zones of the RGA interposer. Embodiments of a semiconductor packaged system include a RGA interposer having a plurality of heater traces, which may be implemented as embedded resistive heaters in a ball grid array (BGA) interconnect substrate for grid/zone heating. As described herein, a "RGA interposer" (or a RGA) refers to a substrate implemented as a late-attach interconnect between a semiconductor package (e.g., a central processing unit (CPU) package) and a package substrate (e.g., a motherboard), where the "RGA interposer" may include embedded resistive heaters separated into zones within one or more arrays that are used to facilitate uniform heating in the RGA interposer.

According to some embodiments, the "RGA interposer" refers to the substrate having a series of embedded resistive heaters (or embedded resistive heater traces) in a plurality of zones, where each zone has embedded heaters that are arranged in a grid pattern. As described herein, a "grid pattern" may refer to a network of intersecting parallel traces as the parallel traces intersect the other parallel traces at substantially right angles and form a pattern of squares (when viewed with a top, perspective view of the network) (e.g., as shown with FIG. 3A). For example, the "grid pattern" of the RGA interposer may have parallel power traces that are disposed/arranged orthogonal to the parallel ground traces to form a pattern of squares, where the pattern of squares has the parallel power traces intersect the parallel ground traces substantially at right angles.

Figure 3A:
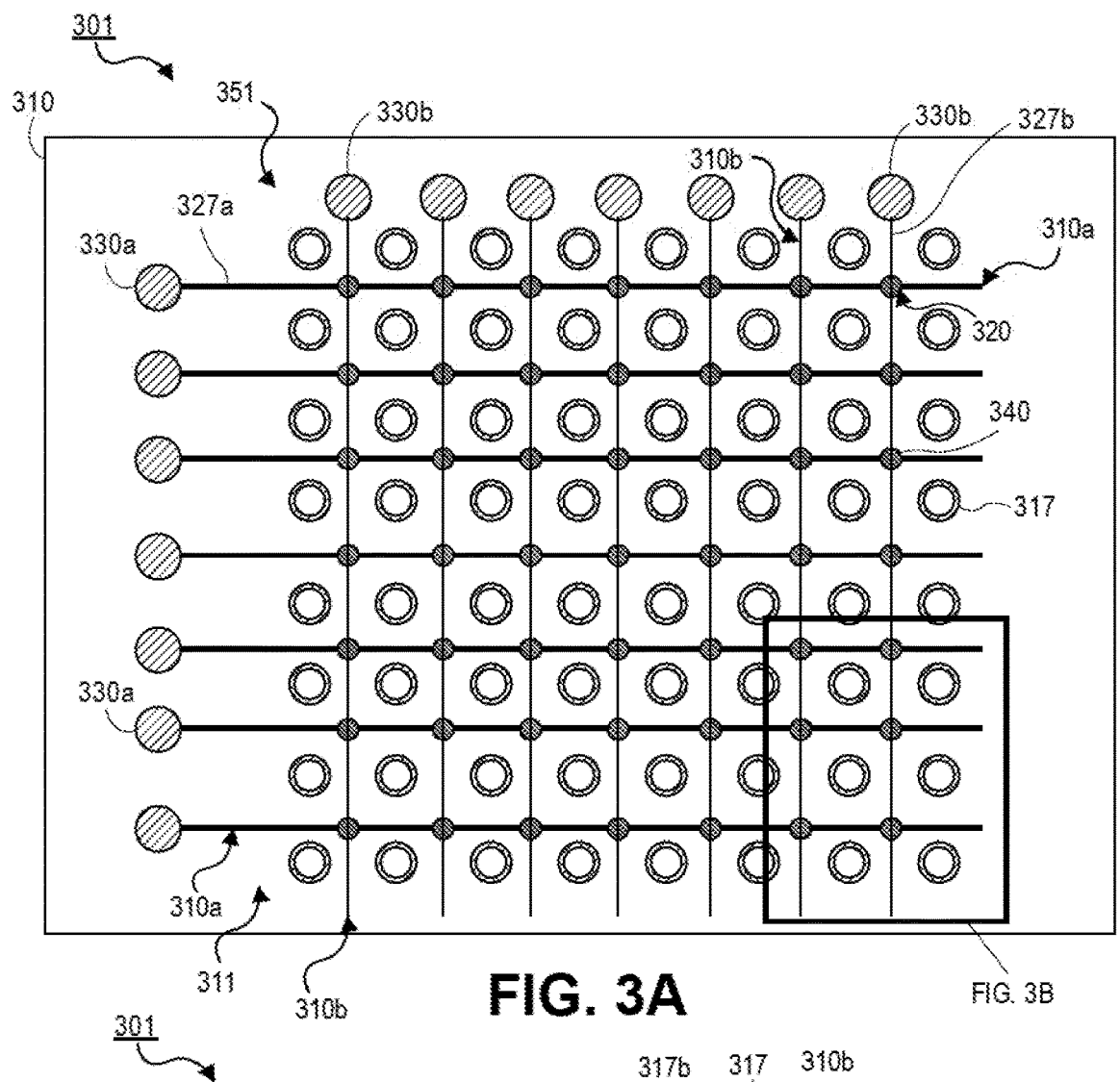
FIG. 3A is an illustration of a plan view of a RGA interposer having a plurality of traces, a plurality of vias, a plurality of connection points, and a plurality of zones with a plurality of heater traces, according to one embodiment.
Figure 3B:
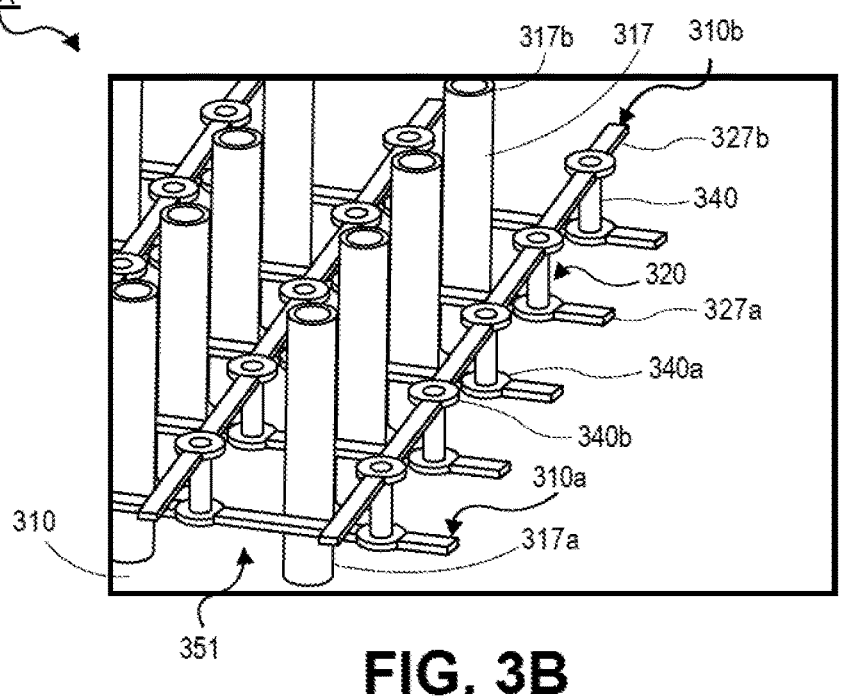
FIG. 3B is a detailed illustration of the respective plan view of a RGA interposer having a plurality of traces, a plurality of vias, a plurality of connection points, and a plurality of zones with a plurality of heater traces, according to one embodiment.
Figure 3C:
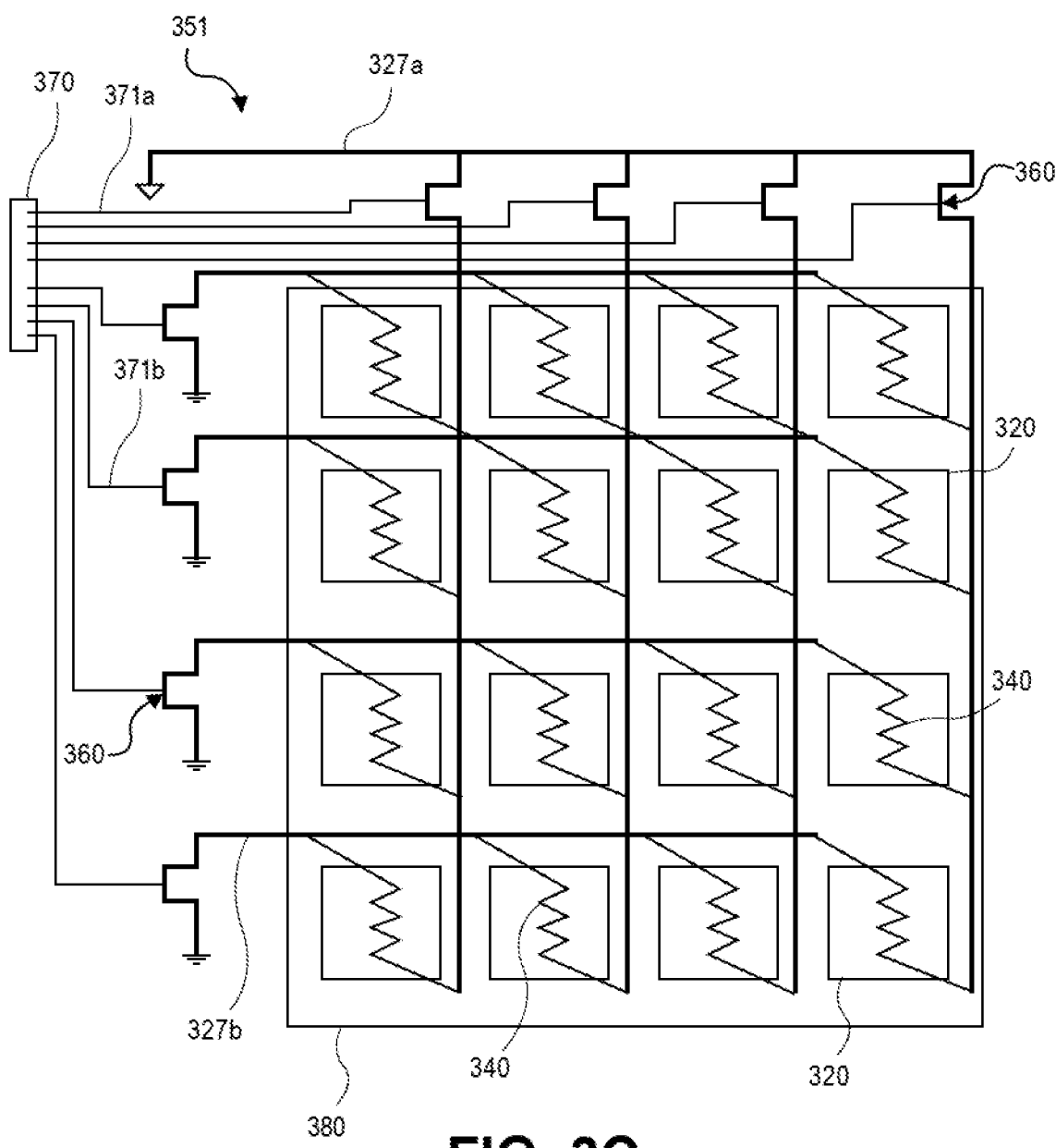
FIG. 3C is an illustration of a schematic block diagram illustrating a grid heater circuit of a RGA interposer, according to one embodiment.

For some embodiments, the embedded resistive heaters of the RGA interposer may include orthogonal traces that are disposed in different layers of the substrate, where the traces may be coupled with each other at the grid intersections with plated-through hole (PTH) vias. The RGA interposer may couple the heater traces with a micro-controller and a multiplexer. The embedded heaters may be powered with the heater traces, where the embedded heaters may be powered with power traces and corresponding ground traces that form a grid heater circuit that enables current to flow to any connected, paired circuit of heater traces in the grid heater circuit (e.g., as shown in FIG. 3C). This enables heating the connected PTH via as a resistive heater, and providing pin-point heating in the substrate at a controlled manner, which provides substantially higher accuracy of localized heat throughout the different zones of the substrate.

Furthermore, the RGA interposer described herein may implement the embedded resistive heater traces as resistive heaters to generate a heated surface (or a plurality of heated surfaces/areas/portions) in one or more zones of the substrate. This heated surface may be used to increase the temperature in any specified zone(s) of the RGA interposer, where the heated surface enables solder ball reflow on the top surface of the substrate of the RGA interposer. For example, the heated surface may be thermally coupled to one or more embedded heater traces, and to one or more conductive pads and solder balls on the top surface of the substrate. The heated surface may thereby implement a predefined temperature to reflow the one or more solder balls on the substrate, and thus couple (or recouple) the semiconductor package to the RGA interposer.

Embodiments of the RGA interposer improve packaging solutions by facilitating late-attach or removal of individual components chips/packages or even modular boards. One of the advantages of the RGA interposer is implementing the embedded resistive heaters to heat the RGA interposer to the solder reflow temperature, which allows for solder attach of individual components. The embedded resistive heaters of the RGA interposer may be separated into zones within the array to be soldered. This improves and facilitates uniform heating in the RGA interposer as thermal uniformity and accuracy is based on the relative size of the zones and number of zones within the RGA interposer. Accordingly, another main advantage of the RGA interposers is maintaining tight temperature controls of the RGA reflow process, which respectively enables a relatively easy late-attach, removal, or repair of components to increase the yield of operational parts.

Some other advantages of the RGA interposer include (i) providing highly precise heating to very localized discrete points in the substrate; (ii) allowing the user to facilitate precision soldering in a manner that would support either substantially smaller pitch arrays, or multi-chip or package components to be soldered at different times without reflowing the adjacent parts; (iii) reducing the energy imparted by the substrate; (iv) reducing (or controlling) the coefficient of thermal expansion (CTE) mismatch between components; (v) increasing the reliability of the formed (or reflowed) solder joints; (vi) faster design times, reducing overall costs, reducing load line impedance (i.e., reducing power/temperature), reducing loading requirements, and enabling pitch translations (e.g., enables compatibility with PCI-express generation 5); and (vii) simplifying the overall RGA design process by implementing a generic RGA interposer design, which provides a fixed pitch array and allows for soldering of a variety of components with the same fixed pitch.

Embodiments of the RGA interposer provide a socket-like alternative that uses simple board technology to speed up design times, lowers cost, reduces keep out zones, and increases performance of the package/system while also lowering temperature. The RGA interposer further enables packaging solution by allowing a last minute attach (LMA) of the CPU package, which is low-cost, easily configurable, and offers supply chain benefits. The RGA interposer may be implemented as solder ball heater substrate, which has temperature sensing, provides optionally power optimization, and may be designed as a socket bill of materials (BOM) option to reduce adoption risk and costs.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, interne devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages/systems having RGA interposers with embedded heater traces in one or more zones of the RGA interposer.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Figure 1:
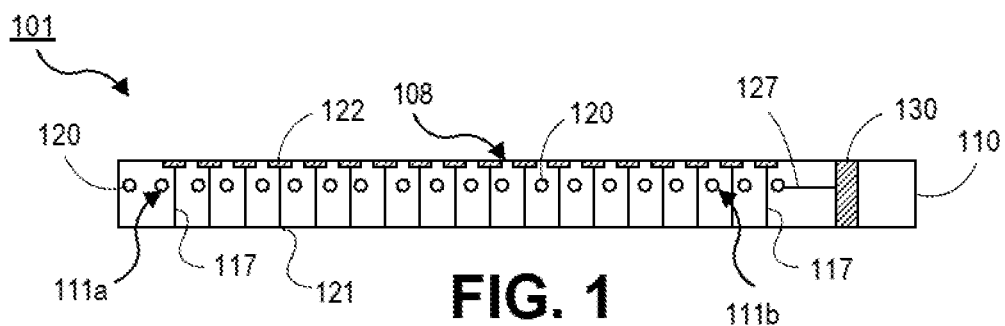
FIG. 1 is an illustration of a reflowable grid array (RGA) interposer with a plurality of heater traces, according to one embodiment.

FIG. 1 is an illustration of a cross-sectional view of a RGA interposer 101 with a plurality of heater traces 120, according to one embodiment. The RGA interposer 101 may include a substrate 110, a plurality of heater traces 120, a plurality of vias 117, a plurality of conductive pads 121-122, and a plurality of connection points 130. For some embodiments, the RGA interposer 101 may have heater traces 120

Figure 4:
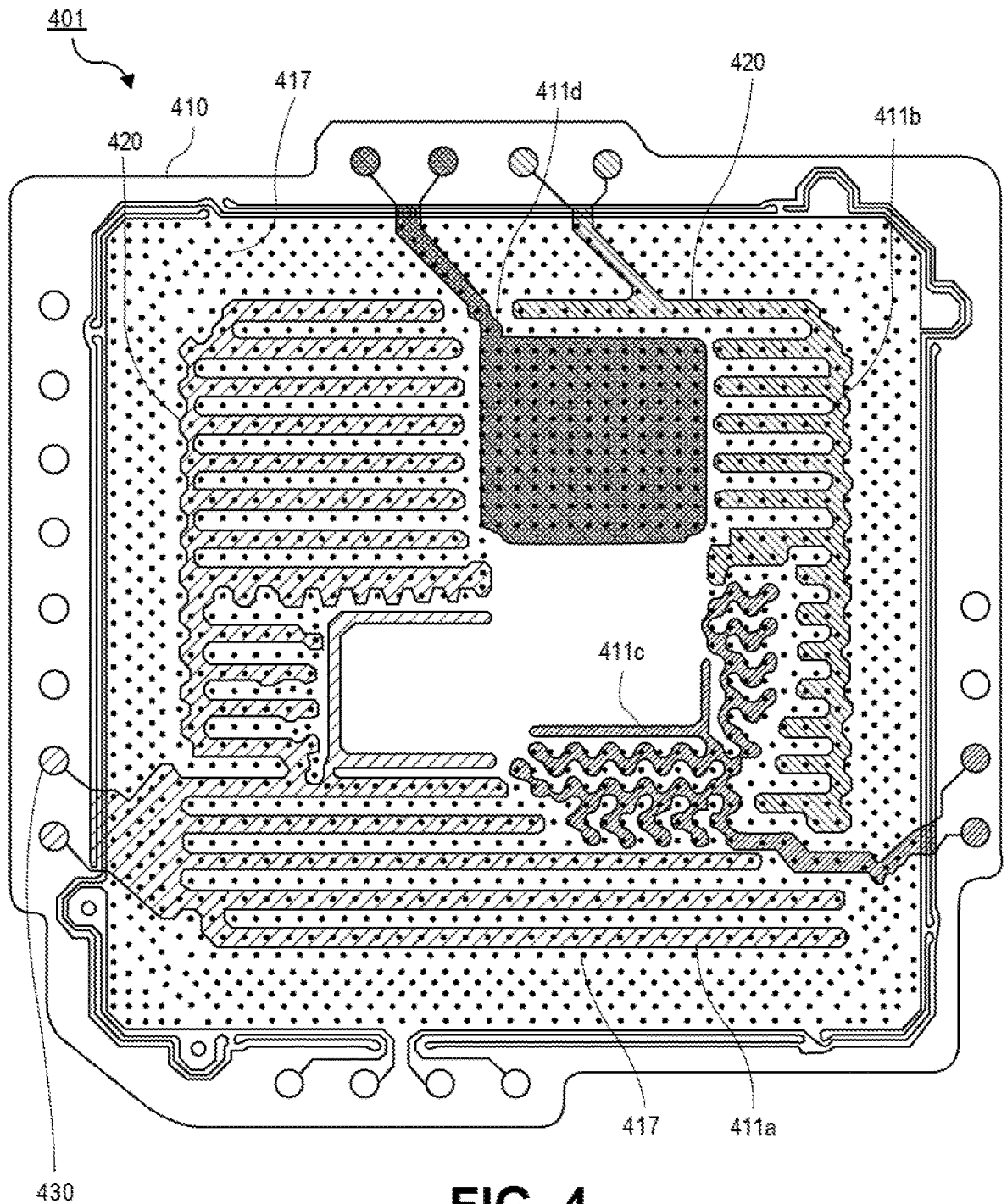
FIG. 4 is an illustration of a plan view of a RGA interposer having a plurality of traces, a plurality of vias, a plurality of connection points, and a plurality of zones with a plurality of heater traces, according to one embodiment.

(or heaters) embedded in a plurality of zones 111a-b of the substrate 110, where the zones 111a-b of the substrate 110 may include 4 zones, 8 zones, 16 zones, or greater than 16 zones based on the desired packaging design/application (e.g., as shown with the plurality of zones 411a-d of FIG. 4). As described herein, a "zone" refers to a portion (or an area, section, etc.) of a substrate, where the substrate may include multiple zones, and where each zone in the substrate may include a plurality of vias and a plurality of embedded heaters having heater traces and via filament interconnects.

In some embodiments, the substrate 110 has a top surface and a bottom surface that is opposite to the top surface. In an embodiment, the vias 117 may be plated-through hole (PTH) vias, and/or drilled and plated/filled vias. Furthermore, in some embodiments, the substrate 110 may also include the heater traces 120 that are embedded in between the vias 117 in a grid pattern (e.g., as shown with the grid pattern 351 of FIG. 3A). As shown in FIG. 1, each of the vias 117 may be disposed between two of the heater traces 120, and/or each of the vias 117 may be disposed adjacent to at least one or more heater traces 120, according to one embodiment. Note that the grid pattern implemented for the arrangement of the heaters 120 and the vias 117 in the zones 111a-b of the substrate 110 is described in further detail below in FIGS. 3A-3C.

For some embodiments, the substrate 110 may have a dimension that is approximately between 10 mm×10 mm to 135 mm×135 mm. In other embodiments, the substrate 110 may have a dimension that is approximately 10 mm×10 mm or less. In addition, the substrate 110 may include the vias 117 having a z-height (or thickness) that is greater than a z-height of the heater traces 120 (e.g., as shown with the detailed illustration of FIG. 3B). That is, each of the vias 117 may have a top end and a bottom end that is opposite to the top end, where the top end may be disposed on the top surface of the substrate 110, and the bottom end may be disposed on the bottom surface of the substrate 110. According to some embodiments, the heater traces 120 may be disposed between the top surface and the bottom surface of the substrate 110. In particular, the heater traces 120 are embedded in one or more layers of the substrate 110 (e.g., as shown with the first layer and second layers 310a-b of FIGS. 3A-3B), where the layers of the substrate 110 are disposed between the top ends and bottom ends of the vias 117.

The substrate 110 may include one or more electronic/conductive structures, such as vias, traces, pads, etc., formed thereon or therein, which may be used to couple an IC die to a package substrate (e.g., as shown in FIGS. 2A-2B and 5A-5B). For one embodiment, the substrate 110 may include one or more different materials, such as an organic substrate made up of one or more layers of polymer base material(s) having conducting regions for transmitting signals, and/or one or more layers of ceramic base material(s) having conductive regions for transmitting signals. The conductive structures/regions of the substrate 110 may variously comprise an alloy of nickel, palladium, and/or tin (and, in some embodiments, copper or other similar metal(s)).

For some embodiments, the RGA interposer 101 may have the first conductive pads 122 disposed on the top surface of the substrate 110, and the second conductive pads 121 disposed on the bottom surface of the substrate 110. The substrate 110 may have the vias 117 extend vertically from the bottom surface to the top surface, where the vias 117 may have the bottom ends of the vias 117 coupled to the second conductive pads 121, and the top ends of the vias 117 coupled to the first conductive pads 122, and where the vias 117 may thus vertically couple the second conductive pads 121 to the first conductive pads 122. In one embodiment, the vias 117 may be signal vias. In addition, the RGA interposer 101 may have the connection points 130 coupled to the heater traces 120 by a plurality of traces 127. In some embodiments, the connection points 130 may include a plurality of power trace multiplexer (MUX) connection points and a plurality of ground trace MUX connection points (e.g., as shown with the power and ground connection points 330a-b of FIG. 3A). For one embodiment, the connection points 130 may be disposed on one or more of the outer, peripheral edges of the substrate 110, where the connection points 130 may extend vertically from the bottom surface to the top surface of the substrate 110.

The connection points 130 may supply electrical signals (e.g., power and ground signals) thru the traces 127 to the heater traces 120. In one embodiment, the traces 127 may be serially connected to the heater traces 120 that are embedded in the substrate 110. Accordingly, the electrical signals may be supplied through the traces 127 to the embedded heater traces 120 to generate a plurality of heated surfaces 108 (or a plurality of uniform heated surfaces/areas/portions) in/on the substrate 110, where the heated surfaces 108 may be coupled (or thermally coupled) to the heater traces 120 and the first conductive pads 122, and where the heated surface 108 may have a first temperature (e.g., the first temperature may be equivalent to a temperature when the heater traces are not operated) that is lower than a second temperature of the heated surfaces 108 (e.g., the second temperature may be equivalent to a temperature needed for different solder reflow(s) when the heater traces are operated). That is, when current passes through one or more of the heater traces 120 within the one or more zones 111a-b of the substrate 110, these respective heater traces 120 may provide Joule heating to the heated surfaces 108 in the zones 111a-b of the substrate 110, where the second temperature of the heated surfaces 108 are proportional to the provided Joule heating that enables a solder reflow of one or more solder balls/joints on the heated surfaces 108 of the substrate 110. In some embodiments, the second temperature of the heated surface 108 may be between approximately 138° C. to 195° C. (e.g., a low-temperature solder ball may reflow at approximately 138° C., and a hybrid solder ball may reflow at approximately 190° C.).

In some embodiments, the heater traces 120 may be implemented as the embedded heaters in the substrate 110 of the RGA interposer 101. Note that, as described herein, the heaters traces 120 may refer to the heaters of the RGA interposer 101. For one embodiment, the heater traces 120 may include via filament structures (or via filament interconnects), such as PTH vias, embedded/buried via structures, and/or drilled and filled vias (e.g., as shown with the via filament interconnects 340 of FIG. 3B). Note that the heater traces 120, for example, a via filament structure/interconnect may act as a filament in a circuit as the via filament interconnect may be coupled on one end of the interconnect to a power source (or a power trace) and on the other end of the interconnect to a ground source (or a ground trace) (e.g., the connection points 130 may be used to supply the power and/or ground sources), where such via filament interconnects may be heated through Joule heating if the circuit was completed and current was applied. For one embodiment, the heater traces 120 may include resistive heating traces (or conductive heating traces) formed of one or more different resistive materials, such as copper, tin, and/or any other similar metal(s)/alloy(s).

In one embodiment, the heater traces 120 may be embedded and arranged in the substrate 110 in a serpentine/wavy pattern. In an alternate embodiment, the heater traces 120 may be arranged in any desired pattern based on the surfaces/portions/edges of the substrate 110 that may need heating. For example, in one embodiment, the heater traces 120 may be arranged and positioned only in the outer edges of the substrate 110 based on the higher probability of issues with the solder balls/joints at these locations of the substrate 110.

In addition, according to one embodiment, the heater traces 120 may be disposed within the same embedded layers of the substrate 110 (i.e., the z-height defined from the bottom surface of the substrate 110 to the layers (or locations) of the heater traces 120 may be approximately the same). Meanwhile, according to other embodiments, the heater traces 120 may be disposed in different layers within the substrate 110 and thus have different z-heights (or thicknesses/depths) (e.g., the heater traces 120 may be disposed/positioned having a first z-height in one or more zones 111a-b of the substrate 110, and a second z-height in the other zones 111a-b of the substrate 110). For example, in these other embodiments, the z-height of the via filament interconnects (or the via filament structures) of some heater traces 120 may be approximately greater than the z-height of the via filament interconnects of the other heater traces 120.

Note that the RGA interposer 101 may include fewer or additional packaging components based on the desired packaging design.

Figure 2A:
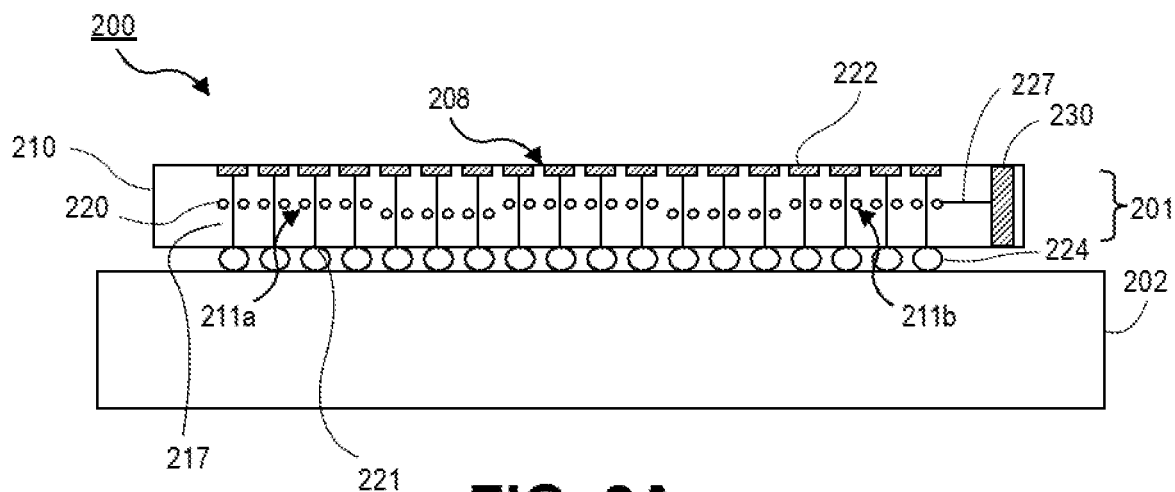
FIG. 2A is an illustration of a cross-sectional view of a semiconductor package with a RGA interposer and a package substrate, where the RGA interposer has a plurality of zones with a plurality of heater traces, according to one embodiment.
Figure 2B:
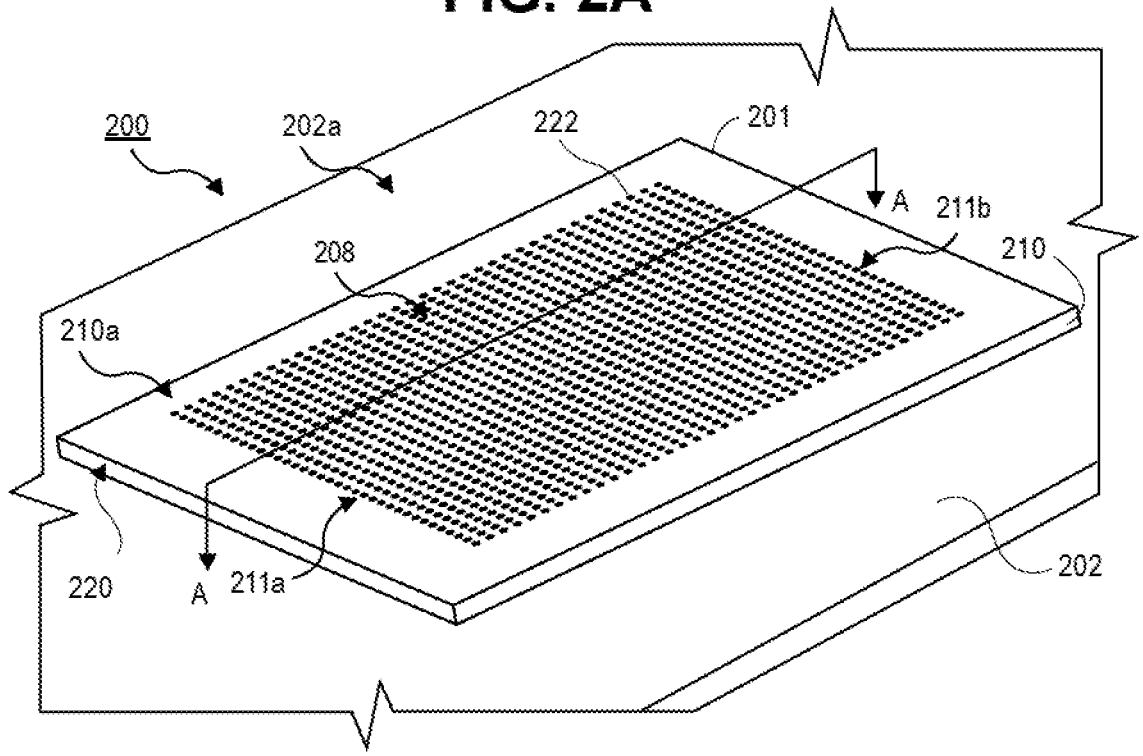
FIG. 2B is an illustration of a plan, perspective view of a semiconductor package with a RGA interposer and a package substrate, where the RGA interposer has a plurality of zones with a plurality of heater traces, according to one embodiment.

FIG. 2A is an illustration of a cross-sectional view of a semiconductor package 200 with a RGA interposer 201 and a package substrate 202, where the RGA interposer 201 has a plurality of zones 211a-b with a plurality of heater traces 220, according to one embodiment. FIG. 2B is an illustration of a plan, perspective view of the respective semiconductor package 200 with a RGA interposer 201 and a package substrate 202, where the RGA interposer 201 has a plurality of zones 211a-b with a plurality of heater traces 220, according to one embodiment. In some embodiments, the RGA interposer 201 may be substantially similar to the RGA interposer 101 of FIG. 1. Accordingly, the components and materials of the RGA interposer 201 may be substantially similar to the RGA interposer 101 of FIG. 1.

Referring now to FIG. 2A, the semiconductor package 200 is shown, according to one embodiment. The semiconductor package 200 may include the RGA interposer 201 disposed on/over the package substrate 202, where the RGA interposer 201 may be coupled to the package substrate 202 with a plurality of solder balls 224. In one embodiment, the package substrate 202 may include, but is not limited to, a package, a substrate, a printed circuit board (PCB), and/or a motherboard. For one embodiment, the package substrate 202 is a motherboard. For one embodiment, the motherboard is made of an FR-4 glass epoxy base with thin copper foil laminated on both sides. For certain embodiments, a multilayer motherboard can be used, with pre-preg and copper foil used to make additional layers. For example, the multilayer motherboard may include one or more dielectric layers, where each dielectric layer can be a photosensitive dielectric layer. For some embodiments, holes may be drilled in the motherboard 202. For one embodiment, the motherboard 202 may also include conductive layers that comprise copper lines/traces, metallic pads, vias, via pads, planes, and/or holes.

In some embodiments, the RGA interposer 201 may include a substrate 210. The substrate 210 may be substantially similar to the substrate 110 of FIG. 1. For one embodiment, the substrate 210 may include a plurality of zones 211a-b, and a plurality of heaters 220 in the plurality of zones 211a-b of the substrate 210, where the plurality of heaters 220 may include a plurality of first traces, a plurality of second traces, and a plurality via filament interconnects (e.g., as shown with the heaters 320 that include the first traces 327a, the second traces 327b, and the via filament interconnects 340 of FIG. 3B).

In some embodiments, each of the zones 211a-b of the substrate 210 may be implemented in a grid pattern (e.g., as shown with the grid pattern 351 in FIGS. 3A-3C), where the grid pattern may be defined with power traces disposed in one layer of the substrate 210, and the ground traces disposed orthogonal to the power traces on another layer above the one layer with the power traces. The grid pattern may implement multiple ground traces that intersect with the power traces, and, at each of these intersections, the grid pattern may have a via filament interconnect coupling the ground trace to the power trace in the z-direction. In one embodiment, the via filament interconnect may be a PTH via, a buried via structure, and/or a drilled and filled via, where such interconnect may act as the filament in the circuit and may be heated through Joule heating as the current is applied through the filament when the circuit is closed.

As shown in FIG. 2A, the substrate 210 may have a top surface and a bottom surface that is opposite to the top surface, where the vias 217 extend vertically substantially from the bottom surface to the top surface, and where the vias 217 are adjacent to the heaters 220. The vias 217 may be formed of any conductive material, such as copper. The substrate 210 may include the plurality of vias 217 that have a z-height that is greater than a z-height of the plurality of heaters 220. The vias 217 may have a top end and a bottom end that is opposite to the top end, where the top end is substantially planar to the top surface of the substrate 210, and the bottom end is substantially planar to the bottom surface of the substrate 210.

According to some embodiments, the RGA interposer 201 may further include a plurality of first conductive pads 222 on the top surface of the substrate 210, where each of the first conductive pads 222 is coupled to the top end of each of the vias 217. The RGA interposer 201 may also include a plurality of second conductive pads 221 on the bottom surface of the substrate 210, where each of the second conductive pads 221 is coupled to the bottom end of each of the vias 217. In addition, the RGA interposer 201 may include a plurality of connection points 230 that are coupled to the heaters 220 with a plurality of traces 227. In one embodiment, the connection points 230 may include a plurality of ground connection points and a plurality of power connections points. The traces 227 may include power traces and ground traces (e.g., as shown in FIGS. 3A-3C).

Figure 5A:
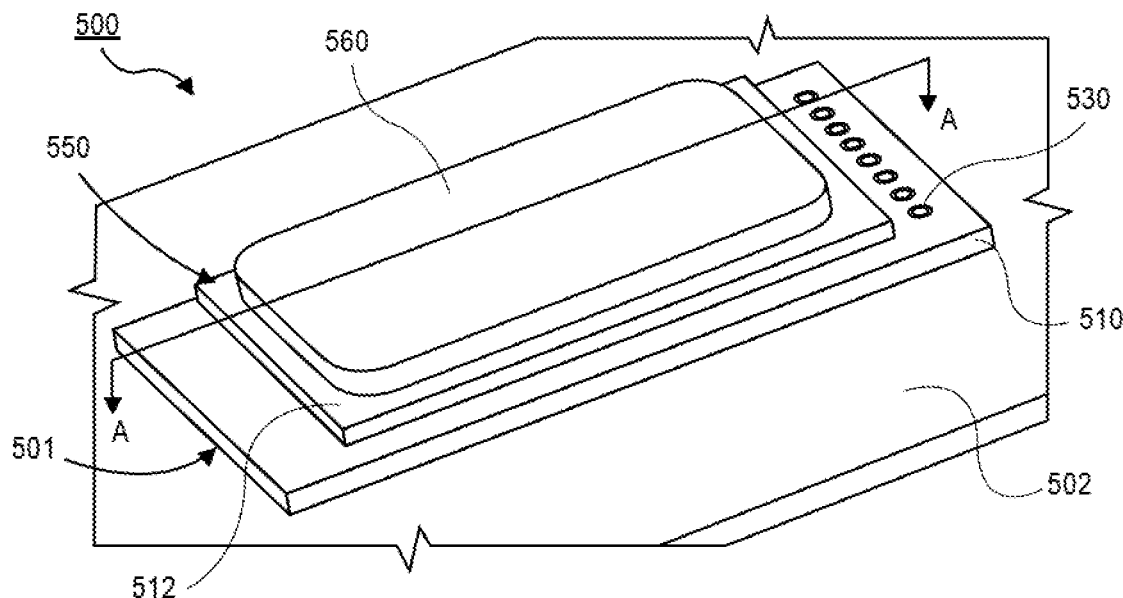
FIG. 5A is an illustration of a plan, perspective view of a semiconductor packaged system with a semiconductor package, a RGA interposer, and a package substrate, where the RGA interposer has a plurality of zones with a plurality of heater traces, according to one embodiment.
Figure 5B:
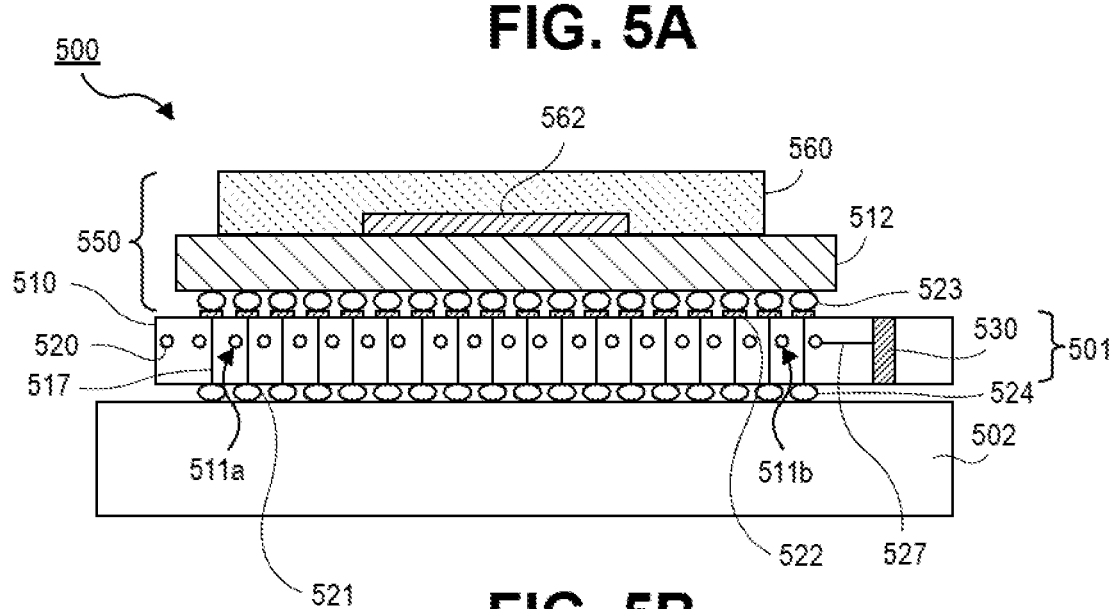
FIG. 5B is an illustration of a cross-sectional view of a semiconductor packaged system with a semiconductor package, a RGA interposer, and a package substrate, where the RGA interposer has a plurality of zones with a plurality of heater traces, according to one embodiment.

Furthermore, in some embodiments, the RGA interposer 201 may have solder balls disposed on the first conductive pads 222 on the top surface of the substrate 210, where the solder balls may be used to couple the substrate 210 to a second substrate (e.g., as shown with the solder balls 523 of FIG. 5B, where the solder balls 523 couple the substrate 510 of the RGA interposer 501 to the semiconductor package 550).

Referring now to FIG. 2B, a top, perspective illustration of the RGA interposer 201 disposed on a top surface 202a of the package substrate 202 is shown. As shown in FIG. 2B, the RGA interposer 201 may have the first conductive pads 222 disposed on the top surface 210a of the substrate 210, where the first conductive pads 222 may be implemented as ball grid array (BGA) joints and/or land grid array (LGA) joints. Similar to the RGA interposer 101 of FIG. 1, the RGA interposer 201 may include a plurality of heated surfaces 208 in the plurality of zones 211a-b of the substrate 210, where the heated surfaces 208 are thermally coupled to the heaters 220, the solder balls, and the first conductive pads 222, where the heated surfaces 208 may have a first temperature that is lower than a second temperature of the heated surfaces 208. For some embodiments, the second temperature of the heated surfaces 208 may be implemented to reflow the solder balls which may be disposed on the top surface 210a of the substrate 210 to couple the RGA interposer 201 to another substrate, such as a CPU package.

In one embodiment, the heaters 220 (or the heater traces) may be embedded and arranged in the substrate 210 in a serpentine/wavy pattern. In an alternate embodiment, the heaters 220 may be arranged in any desired pattern based on the surfaces/portions/edges of the substrate 210 that may need heating. For example, in one embodiment, the heaters 220 may be arranged and positioned only in the outer edges of the substrate 210 based on the higher probability of issues with the solder balls/joints at these locations of the substrate 210.

Note that the RGA interposer 201 of FIGS. 2A-2B may include fewer or additional packaging components based on the desired packaging design.

FIG. 3A is an illustration of a plan view of a RGA interposer 301 having a plurality of traces 327a-b, a plurality of vias 317, a plurality of connection points 330a-b, and a zone 311 with a plurality of heaters 320, according to one embodiment. FIG. 3B is a detailed illustration of the respective plan view of the RGA interposer 301 with the embedded heaters 320, according to one embodiment. In some embodiments, the RGA interposer 301 may be substantially similar to the RGA interposers 101 and 201 of FIGS. 1-2B. Accordingly, in these embodiments, the components and materials of the RGA interposer 301 may be substantially similar to the components and materials of the RGA interposers 101 and 201 of FIGS. 1-2B.

Referring now to FIG. 3A, the RGA interposer 301 with the heaters 320 arranged in a grid pattern 351 is shown, according to one embodiment. The RGA interposer 301 may include the substrate 310. The substrate 310 may be substantially similar to the substrates 110 and 210 of FIGS. 1-2B. As shown in FIG. 3A, the substrate 310 may include the zone 311 that may be arranged in the grid pattern 351. Note that, for simplicity, only one zone 311 is illustrated in the substrate 310, however the substrate 310 may include one or more zones (e.g., the substrate 310 may have 16 or more zones based on the desired packaging design).

For some embodiments, the substrate 310 may include a first layer 310a (or a first conductive layer) and a second layer 310b, where the second layer 310b may be disposed over the first layer 310a. In one embodiment, the first layer 310a may include the plurality of first traces 327a, and the second layer 310b may include the plurality of second traces 327b. In these embodiments, the substrate 310 may implement the intersections of the first and second traces 327a-b, the connection points 330a-b, and the heaters 320 to form the grid pattern 351.

The grid pattern 351 may include the plurality of first traces 327a and the plurality of second traces 327b. For some embodiments, the grid pattern 351 may include disposing the first traces 327a orthogonal (or substantially perpendicular) to the second traces 327b, where the second traces 327b within the second layer 310b of the substrate 310 are disposed (or run) orthogonally over/above the first traces 327a within the first layer 310a of the substrate 310 as shown in FIG. 3B.

In one embodiment, the first traces 327a may be power traces, and the second traces 327b may be ground traces. Accordingly, the grid pattern 351 may implement multiple power traces 327a that are disposed perpendicular to the ground traces 327b, and, at each of these intersections (e.g., in the z-plane as shown with the plan/top view of FIG. 3A), a via filament interconnect 340 may be disposed vertically to couple the power traces 327a to the ground traces 327b in the z-direction. In one embodiment, at each of these intersections, the grid pattern 351 thus implements one of the heaters 320 having the via filament interconnect 340 coupled to the first trace 327a and the second trace 327b. For one embodiment, the via filament interconnect 340 may be a PTH via, a buried via structure, and/or a drilled and filled via, where the via filament interconnect 340 may act as a filament in a circuit and may be heated through Joule heating as the current is applied through the filament when the circuit is closed.

In some embodiments, the first traces 327a may be coupled to a power source with the connection points 330a, and the second traces 327b may be coupled to a ground source with the connection points 330b. As shown in FIG. 3A, the grid pattern 351 may have each of the first traces 327a run parallel to each other, and each of the second traces 327b run parallel to each other, where these respective traces 327a-b thus run orthogonally to each other to form a plurality of squares. Each of the plurality of squares of the grid pattern 351 may include four angles, where each angle includes one of the heaters 320 based on the intersection of one of the first traces 327a and one of the second traces 327b, and the via filament interconnect 340 that couples the respective first trace 327a to the second trace 327b. As shown in FIG. 3A, in one embodiment, each square of the grid pattern 351 may have four heaters 320 (or four or more heaters 320) that surround at least one of the vias 317.

The grid pattern 351 may include the connection points 310a-b to provide the power/ground signals to the first and second traces 327a-b. In some embodiments, the connection points 330a may include a plurality of power MUX connection points and a plurality of ground MUX connection points. For one embodiment, the connection points 330a-b may be disposed on one or more of the outer, peripheral edges of the substrate 310. The substrate 310 may implement the connection points 310a to couple the first traces 327a to the power supply, and the connection points 330b to couple the second traces 327b to the ground supply.

Referring now to FIG. 3B, a perspective view illustration of the substrate 310 of the RGA interposer 301 is shown, according to one embodiment. As described above, the RGA interposer 301 has the heaters 320 disposed (or embedded) within the substrate 310 in the grid pattern 351. For one embodiment, the heater 320 may include the via filament interconnect 340 that couples the first and second traces 327a-b. For example, the via filament interconnect 340 may have a bottom end 340a and a top end 340b that is opposite to the bottom end 340a. The bottom end 340a of the via filament interconnect 340 may be coupled directly to the first trace 327a in the first layer 310a. The top end 340b of the via filament interconnect 340 may be coupled directly to the second trace 327b in the second layer 310b. In one embodiment, the bottom and top ends 340a-b of the via filament interconnect 340 may be any type of conductive pad.

Note that, for simplicity, the first and second traces 327a-b may be shown as straight lines, however the first and second traces 327*a-b* may be wavy and/or serpentine lines, where the wavy/serpentine lines 327*a-b* may be disposed (or positioned) to surround the vias 317. As shown in FIG. 3B, each of the vias 317 may have a top end 317*b* and a bottom end 317*a* that is opposite to the top end 317*b*, where the top end 317*b* of the via 317 may be disposed above the top end 340*b* of the via filament interconnect 340, and the bottom end 317*a* of the via 317 may be disposed below the bottom end 340*a* of the via filament interconnect 340. Accordingly, the heaters 320 may be disposed between the bottom and top ends 317*a-b* of the vias 317 in the z-direction. In particular, the heaters 320 may have a z-height that is less than a z-height of the via 317 as illustrated in the detailed view of FIG. 3B.

FIG. 3C is an illustration of a schematic block diagram illustrating a grid heater circuit of the respective grid pattern 351 of the RGA interposer 301, according to one embodiment. For one embodiment, the RGA interposer 301 includes the heaters 320 disposed in the grid pattern 351. The RGA interposer 301 may further include a microcontroller 370 and a MUX 380 that are used to individually (or discretely) control each of the heaters 320 in the grid heater circuit.

In one embodiment, the microcontroller 370 may be a digital or an analog input/output (I/O) controller die, which may be implemented, by the RGA interposer 301, to address/control/supply the power and ground signals via the I/O traces 371*a-b* to the heaters 320. For one embodiment, the MUX 380 may be an electronic device and/or a die, which may be implemented, by the RGA interposer 301, to combine several digital or analog signals, such as the I/O traces 371*a-b*, and forward them into a single output line. The MUX 380 may use one or more transistors 360 to combine and supply/forward the various input and out lines/signals.

As shown in FIG. 3C, the RGA interposer 301 may route the power traces 327*a* to the MUX 380 in the grid heater circuit, and couple the ground traces 327*b* to the microcontroller 370 and the MUX 380. Under operational conditions in some embodiments, the microcontroller 370 may energize the MUX 380 and complete the circuit between a single power trace 327*a* and a single ground trace 327*b*, which thus allows, at the intersection of both traces 327, Joule heating to occur through the via filament interconnect 340 of a single heater 320. Accordingly, in these embodiments, the microcontroller 370 may be programmed to close circuits in the grid pattern 351 in a specific arrangement or a specific sequence of locations, which may enable the microcontroller 370 to control each of the heaters 320 within the grid pattern 351 with the Joule heating at precise discrete points (i.e., precise heaters 320). This grid heater circuit of the RGA interposer 301 may thus allow for highly concentrated heating to occur in one or more zones, thereby facilitating one or more heating surfaces (or conductive heating area) to adjacent pads (e.g., the conductive pads 222 of the RGA interposer 201 of FIGS. 2A-2B) to enable a solder ball to solder ball heating control that would be based on the pitch of the grid pattern 351.

Note that the RGA interposer 301 of FIGS. 3A-3C may include fewer or additional packaging components based on the desired packaging design.

FIG. 4 is an illustration of a plan view of a RGA interposer 401 having a plurality of vias 417, a plurality of connection points 430, and a plurality of zones 411*a-d* with a plurality of heaters 420, according to one embodiment. In some embodiments, the RGA interposer 401 may be substantially similar to the RGA interposers 101, 201, and 301 of FIGS. 1-3C. Accordingly, in these embodiments, the components and materials of the RGA interposer 401 may be substantially similar to the components and materials of the RGA interposers 101, 201, and 301 of FIGS. 1-3C.

As illustrated in FIG. 4, the RGA interposer 401 with the substrate 410 having the zones 411*a-d* and the heaters 420 is shown, according to one embodiment. The substrate 410 may have the zones 411*a-d*, where each of the zones 411*a-d* may cover different surfaces (or portions/areas) of the substrate 410. In some embodiments, each of the zones 411*a-d* may include one or more of the heaters 420. The respective heaters 420 within each of the zones 411*a-d* may be implemented to generate a precise heated surface with a defined temperature, where the precise heated surface may surround the respective vias 417 and the pads of the respective vias 417.

This allows the substrate 410 to have different heating zones 411*a-d*, where one of the zones 411*a-d* may be heated as the other zones 411*a-d* may not be heated. For example in FIGS. 3A-3C, the substrate 410 may utilize the connection points 430 and other heating devices, such as the microcontroller, the MUX, and the power/ground traces, to precisely control the heating (or heating surfaces) of the heaters 420 within each of the zones 411*a-d*. Accordingly, this enables the RGA interposer 401 to provide precise soldering reflow(s) to precise locations (i.e., precise pads, vias, and solder balls/joints) on the top surface of the substrate 410, and to therefore couple (and/or recouple) the substrate 410 to another substrate, such as a CPU package (e.g., as shown below in FIGS. 5A-5B).

Note that the RGA interposer 401 may include fewer or additional packaging components based on the desired packaging design.

FIG. 5A is an illustration of a plan, perspective view of a semiconductor packaged system 500 with a semiconductor package 550, a RGA interposer 501, and a package substrate 502, where the RGA interposer 501 has a plurality of zones with a plurality of heater traces, according to one embodiment. FIG. 5B is the respective illustration of the cross-sectional view of the semiconductor packaged system 500 with the semiconductor package 550, the RGA interposer 501, and the package substrate 502, where the RGA interposer 501 has a plurality of zones with a plurality of heater traces, according to one embodiment. In some embodiments, the RGA interposer 501 may be substantially similar to the RGA interposers 101, 201, 301, and 401 of FIGS. 1-4. Note that the semiconductor packaged system 500 is not limited to the illustrated semiconductor packaged system, and thus may be designed/formed with fewer, alternate, or additional packaging components and/or with different interconnecting structures.

Referring now to FIG. 5A, the semiconductor packaged system 500 is merely one example of an embodiment of a semiconductor packaged system. According to one embodiment, the semiconductor packaged system 500 may include the semiconductor package 550 disposed on the RGA interposer 501, where the RGA interposer 501 may be disposed on the package substrate 502. For one embodiment, the semiconductor packaged system 500 may include a BGA package, a LGA package, and/or a pin grid array (PGA) package.

For one embodiment, the semiconductor package 550 may include a heatsink 560 and a die 562 that are coupled to a substrate 512. According to one embodiment, the semiconductor package 550 is merely one example of an embodiment of a CPU package, where the CPU package 550 may be coupled to the RGA interposer 501 with a plurality of solder balls 523 (as shown in FIG. 5B).

As described above, a solder ball/joint formed by soldering of a microbump according to an embodiment may itself be referred to as a "bump" and/or a "microbump." For one embodiment, the semiconductor package 550 may have the heatsink 560 disposed over the die 562, where both the stacked heatsink 560 and the die 562 are disposed on the substrate 512. In one embodiment, the heatsink 560 may be any structure or component that is generally used to dissipate heat.

According to some embodiments, the substrate 512 may include, but is not limited to, a package, a substrate, a PCB, and/or a motherboard. For one embodiment, the substrate 512 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 512. For one embodiment, the PCB 512 may also include conductive layers that comprise copper lines/traces, metallic pads, vias, via pads, planes, and/or holes.

For one embodiment, the die 562 may include, but is not limited to, a semiconductor die, an electronic device (e.g., a wireless device), an integrated circuit (IC), a central processing unit (CPU), a microprocessor, a platform controller hub (PCH), a memory, and/or a field-programmable gate array (FPGA). The die 562 may be formed from a material such as silicon and have circuitry thereon that is to be coupled to the substrate 512.

As shown in FIG. 5A, the semiconductor packaged system 500 may implement the RGA interposer 501 to couple the semiconductor package 550 to the package substrate 502. For some embodiments, the package substrate 502 may include, but is not limited to, a package, a substrate, a PCB, and/or a motherboard. For one embodiment, the package substrate 502 is a motherboard. For one embodiment, the motherboard is made of an FR-4 glass epoxy base with thin copper foil laminated on both sides. For certain embodiments, a multilayer motherboard can be used, with pre-preg and copper foil used to make additional layers. For example, the multilayer motherboard may include one or more dielectric layers, where each dielectric layer can be a photosensitive dielectric layer. For some embodiments, holes may be drilled in the motherboard 502. For one embodiment, the motherboard 502 may also include conductive layers that comprise copper lines/traces, metallic pads, vias, via pads, planes, and/or holes.

The package substrate 502 may include a variety of electronic structures formed thereon or therein. As described above, the RGA interposer 501 may also include electronic structures formed thereon or therein, which may be used to couple the semiconductor package 550 to the package substrate 502. For one embodiment, one or more different materials may be used for forming the package substrate 502, the RGA interposer 501, and the substrate 512. In certain embodiments, the package substrate 502 and the substrate 512 are organic substrates made up of one or more layers of polymer base materials, with conducting regions for transmitting signals. In certain embodiments, the RGA interposer 501 includes a substrate 510 that may be made up of a ceramic base material including metal regions for transmitting signals (e.g., the vias 517 as shown in FIGS. 5B), where the substrate 510 may have a plurality of connection points 530 and a plurality of zones 511a-b.

Referring now to FIG. 5B, the semiconductor packaged system 500 with a plurality of first solder balls 523 and a plurality of second solder balls 524 is shown. According to one embodiment, the semiconductor packaged system 500 may couple the semiconductor package 550 onto the RGA interposer 501 with the first solder balls 523, and the RGA interposer 501 onto the package substrate 502 with the second solder balls 524.

As described above, the RGA interposer 501 may be substantially similar to the RGA interposer 101 of FIG. 1. Accordingly, the RGA interposer 501 includes a substrate 510, a plurality of heater traces 520, a plurality of vias 517, a plurality of conductive pads 521-522, and a plurality of connection points 530. For some embodiments, the RGA interposer 501 may have heater traces 520 embedded in the substrate 510. Note that the substrate 510, the heater traces 520, the vias 517, the conductive pads 521-522, the zones 511a-b, and the connections points 530 may be substantially similar to the substrate 110, the heater traces 120, the vias 117, the conductive pads 121-122, the zones 111a-b, and the connections points 130 of FIG. 1.

As shown in FIG. 5B, the RGA interposer 501 may use the first solder balls 523 on the top surface of the substrate 510 to couple to the semiconductor package 550. Similarly, the RGA interposer 501 may use the second solder balls 524 on the bottom surface of the substrate 510 to couple to the package substrate 502. The RGA interposer 501 may implement the substrate 510 as a late-attach interconnect between the semiconductor package 550, such as the CPU package, and the package substrate 502, such as the motherboard. In some embodiments, the RGA interposer 501 is attached to the package substrate 502 using existing reflow processes typically used as part of the standard packaging, manufacturing process.

As described above, the RGA interposer 501 has resistance heater traces 520 that are embedded in the RGA substrate material of the substrate 510. The heater traces 520 may be embedded in specific zones in/on the RGA interposer 501 to allow zone heating of the substrate 510 up to applicable temperatures used for solder ball reflow(s). Powering the heater traces 520 of the RGA interposer 501 allows direct solder components, such as the semiconductor package 550, to be attached to the top surface of the substrate 510 of the RGA interposer 501. For example, powering the heater traces 520 may be implemented after the standard reflow process of the package substrate 502 is finalized, thus allowing for the late-attach of the semiconductor package 550 and other components to the package substrate 502 using the RGA interposer 501 as the interconnect (i.e., the RGA interposer 501 may be used as a self-soldering substrate). As such, the RGA interposer 501 may be incorporated into the fully configured semiconductor packaged system 500 at the package substrate manufacturing site and/or the final integration of the package substrate 502.

Additionally, in some embodiments, the embedded resistance heater traces 520 in the substrate 510 of the RGA interposer 501 may be used as a local heater to maintain/control a temperature above the local ambient temperature for the package substrate 502. This temperature monitoring may be accomplished with the addition of control circuitry either disposed (or attached) directly onto the RGA interposer (e.g., as shown with the RGA interposer 301 of FIG. 3) or disposed (or incorporated) into/onto the package substrate 502.

The control circuitry would actively monitor the local ambient temperature of the RGA interposer 501 and apply current through a plurality of traces 527 to the heater traces 520 when the local ambient temperature on the RGA interposer 501 drops below the desired set point/value. In some embodiments, the plurality of traces 527 may be substantially similar to the traces of FIG. 1. In this way, the range of temperatures that the semiconductor packaged system 500 would be subjected to could be greatly reduced. For example, when the desired control set point is 5° C., then the environmental conditions could be reduced from −40° C. to 105° C. and from 5° C. to 105° C. These new standby/operating embodiments described herein would essentially eliminate the CPU latency of the semiconductor package 550 that occurs when the die 560 is subjected to temperatures below 0° C.

Note that the semiconductor packaged system 500 of FIGS. 5A-5B may include fewer or additional packaging components based on the desired packaging design.

Figure 6:
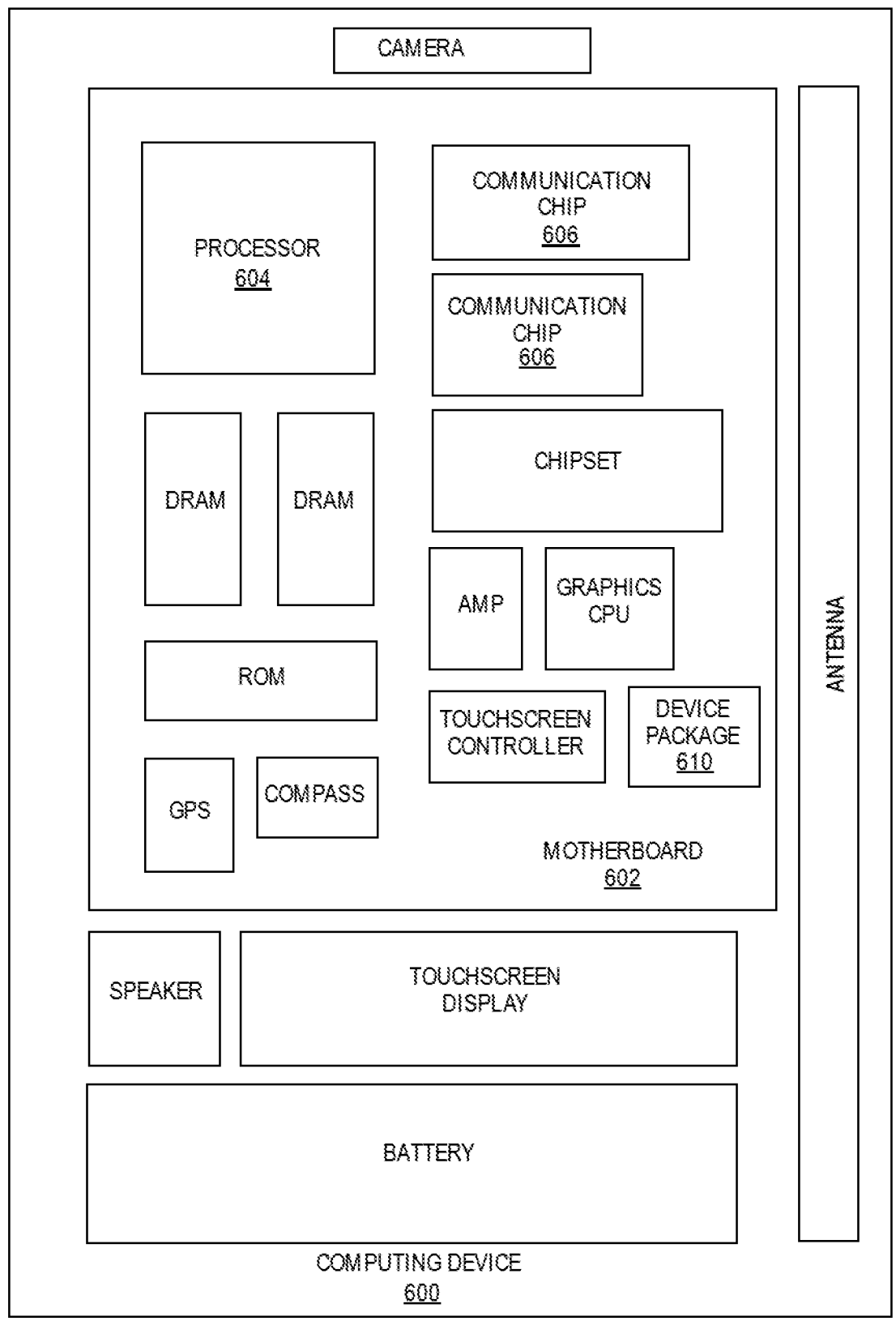
FIG. 6 is an illustration of a schematic block diagram illustrating a computer system that utilizes a RGA interposer having a plurality of zones with a plurality of heater traces, according to one embodiment.

FIG. 6 is an illustration of a schematic block diagram illustrating a computer system 600 that utilizes a device package 610 (or a semiconductor packaged system) having a RGA interposer with a plurality of zones with a plurality of heater traces, according to some embodiments. FIG. 6 illustrates an example of computing device 600.

Computing device 600 houses motherboard 602. For one embodiment, motherboard 602 may be similar to the substrates 202 and 502 of FIGS. 2A-2B and 5A-5B. Motherboard 602 may include a number of components, including but not limited to processor 604, device package 610 (or semiconductor package system), and at least one communication chip 606. Processor 604 is physically and electrically coupled to motherboard 602. For some embodiments, at least one communication chip 606 is also physically and electrically coupled to motherboard 602. For other embodiments, at least one communication chip 606 is part of processor 604.

Depending on its applications, computing device 600 may include other components that may or may not be physically and electrically coupled to motherboard 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. Device package 610 may be, but is not limited to, a substrate, a package substrate, and/or a PCB. In one embodiment, device package 610 may be a semiconductor packaged system as described herein. Device package 610 may include a semiconductor package, a RGA interposer, and a package substrate (e.g., as illustrated in FIGS. 5A-5B)—or any other components from the figures described herein. In one embodiment, the device package 610 includes the RGA interposer described herein that has a plurality of zones, where each zone has a plurality of heaters to generate a defined temperature for a heated surface of the RGA interposer, and where the heated surface thus enables reflow(s) of solder balls/joints disposed on the heated surface of the RGA interposer. For example, the device package 610 of the computing device 600 may thus implement the RGA interposer to enable a late-attach interconnect between a die (or a CPU package) and a package substrate, where the RGA interposer may include resistive heater traces embedded in the RGA substrate to provide heating for solder ball reflows between the die and the RGA substrate.

Note that device package 610 may be a single component/device, a subset of components, and/or an entire system, as the materials, features, and components may be limited to device package 610 and/or any other component of the computing device 600 that may need the RGA interposer with embedded heater traces in different zones (e.g., the motherboard 602, the processor 604, and/or any other component of the computing device 600 may need the embodiments of the RGA interposer as described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 606 also includes an integrated circuit die packaged within the communication chip 606. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a reflowable grid array (RGA) interposer, comprising: a substrate having a plurality of zones; a plurality of heaters in the plurality of zones of the substrate, wherein the plurality of heaters include a plurality of first traces, a plurality of second traces, and a plurality of via filament interconnects; and a plurality of vias in the substrate, wherein the plurality of vias have a z-height that is greater than a z-height of the plurality of heaters, and wherein each of the plurality of zones has a grid pattern.

In example 2, the subject matter of example 1 can optionally include a first layer in the substrate, wherein the first layer includes the plurality of first traces; and a second layer in the substrate, wherein the second layer includes the plurality of second traces, and wherein the second layer is over the first layer.

In example 3, the subject matter of examples 1-2 can optionally include that the grid pattern includes the plurality of first traces and the plurality of second traces, wherein each of the plurality of first traces in the grid pattern are parallel to each other, wherein each of the plurality of second traces in the grid pattern are parallel to each other, wherein the parallel plurality of first traces of the grid pattern are orthogonal to the parallel plurality of second traces of the grid pattern to form a pattern of squares, and wherein the pattern of squares has the plurality of first traces intersect the plurality of second traces substantially at right angles.

In example 4, the subject matter of examples 1-3 can optionally include that each of the plurality of via filament interconnects is located at each right angle of the grid pattern, wherein each of the via filament interconnects has a top end and a bottom end that is opposite to the top end, and wherein each of the via filament interconnects is coupled to one of the plurality of first traces on the top end and one of the plurality of second traces on the bottom end.

In example 5, the subject matter of examples 1-4 can optionally include that the substrate has a top surface and a bottom surface that is opposite to the top surface, wherein the plurality of vias extend vertically substantially from the bottom surface to the top surface, wherein the pattern of squares surround one or more of the plurality of vias, wherein the plurality of vias are adjacent to the plurality of heaters, and wherein the plurality of heaters are resistive heaters.

In example 6, the subject matter of examples 1-5 can optionally include that the plurality of first and second traces are wavy lines, wherein the plurality of first traces are coupled to a ground source, wherein the plurality of second traces are coupled to a power source, wherein each of the plurality of vias has a top end and a bottom end that is opposite to the top end, wherein the top end is substantially planar to the top surface of the substrate, and wherein the bottom end is substantially planar to the bottom surface of the substrate.

In example 7, the subject matter of examples 1-6 can optionally include a plurality of first conductive pads on the top surface of the substrate, wherein each of the plurality of first conductive pads is coupled to the top end of each of the plurality of vias; a plurality of second conductive pads on the bottom surface of the substrate, wherein each of the plurality of second conductive pads is coupled to the bottom end of each of the plurality of vias; a plurality of connection points coupled to the plurality of first and second traces of the plurality of heater traces, wherein the plurality of connection points include a plurality of ground connection points and a plurality of power connections points, wherein the plurality of ground connection points are coupled to the plurality of first traces, and wherein the plurality of power connection points are coupled to the plurality of second traces; a multiplexer in the substrate; and a microcontroller in the substrate, wherein the microcontroller is coupled to the multiplexer, the plurality of connection points, and the plurality of heaters.

In example 8, the subject matter of examples 1-7 can optionally include a plurality of solder balls on the plurality of first conductive pads on the top surface of the substrate, wherein the plurality of solder balls couples the substrate to a second substrate; and a plurality of heated surfaces in the plurality of zones of the substrate, wherein the plurality of heated surfaces are thermally coupled to the plurality of heaters, the plurality of solder balls, and the plurality of first conductive pads, and wherein the plurality of heated surfaces have a first temperature that is lower than a second temperature of the plurality of heated surfaces.

In example 9, the subject matter of examples 1-8 can optionally include that the second temperature of the plurality of heated surfaces reflows the plurality of solder balls to couple the substrate to the second substrate.

Example 10 is a semiconductor packaging system, comprising: a RGA interposer on a package substrate; and a semiconductor package on the RGA interposer, wherein the RGA interposer includes a substrate having a plurality of zones; a plurality of heaters in the plurality of zones of the substrate, wherein the plurality of heaters include a plurality of first traces, a plurality of second traces, and a plurality of via filament interconnects; and a plurality of vias in the substrate, wherein the plurality of vias have a z-height that is greater than a z-height of the plurality of heaters, and wherein each of the plurality of zones has a grid pattern.

In example 11, the subject matter of example 10 can optionally include that the semiconductor package further comprises: a die on a first substrate; a heatsink over the die, wherein the heatsink is on the first substrate; and a plurality of first solder balls on a bottom surface of the first substrate, wherein the plurality of first solder balls couples the bottom surface of the first substrate of the semiconductor package to the top surface of the substrate of the RGA interposer.

In example 12, the subject matter of examples 10-11 can optionally include that the first substrate includes a ball grid array (BGA) or a land grid array (LGA), and wherein the die includes an integrated circuit (IC), a central processing unit (CPU), a microprocessor, a platform controller hub (PCH), a memory, or a field-programmable gate array (FPGA).

In example 13, the subject matter of examples 10-12 can optionally include a plurality of second solder balls coupled to the bottom surface of the RGA interposer and a top surface of the package substrate.

In example 14, the subject matter of examples 10-13 can optionally include a first layer in the substrate, wherein the first layer includes the plurality of first traces; and a second layer in the substrate, wherein the second layer includes the plurality of second traces, and wherein the second layer is over the first layer.

In example 15, the subject matter of examples 10-14 can optionally include that the grid pattern includes the plurality of first traces and the plurality of second traces, wherein each of the plurality of first traces in the grid pattern are parallel to each other, wherein each of the plurality of second traces in the grid pattern are parallel to each other, wherein the parallel plurality of first traces of the grid pattern are orthogonal to the parallel plurality of second traces of the grid pattern to form a pattern of squares, and wherein the pattern of squares has the plurality of first traces intersect the plurality of second traces substantially at right angles.

In example 16, the subject matter of examples 10-15 can optionally include that each of the plurality of via filament interconnects is located at each right angle of the grid pattern, wherein each of the via filament interconnects has a top end and a bottom end that is opposite to the top end, and wherein each of the via filament interconnects is coupled to one of the plurality of first traces on the top end and one of the plurality of second traces on the bottom end.

In example 17, the subject matter of examples 10-16 can optionally include that the substrate has a top surface and a bottom surface that is opposite to the top surface, wherein the plurality of vias extend vertically substantially from the bottom surface to the top surface, wherein the pattern of squares surround one or more of the plurality of vias, wherein the plurality of vias are adjacent to the plurality of heaters, and wherein the plurality of heaters are resistive heaters.

In example 18, the subject matter of examples 10-17 can optionally include that the plurality of first and second traces are wavy lines, wherein the plurality of first traces are coupled to a ground source, wherein the plurality of second traces are coupled to a power source, wherein each of the plurality of vias has a top end and a bottom end that is opposite to the top end, wherein the top end is substantially planar to the top surface of the substrate, and wherein the bottom end is substantially planar to the bottom surface of the substrate.

In example 19, the subject matter of examples 10-18 can optionally include a plurality of first conductive pads on the top surface of the substrate, wherein each of the plurality of first conductive pads is coupled to the top end of each of the plurality of vias, and wherein the plurality of first solder balls are on the plurality of first conductive pads; a plurality of second conductive pads on the bottom surface of the substrate, wherein each of the plurality of second conductive pads is coupled to the bottom end of each of the plurality of vias; a plurality of connection points coupled to the plurality of first and second traces of the plurality of heater traces, wherein the plurality of connection points include a plurality of ground connection points and a plurality of power connections points, wherein the plurality of ground connection points are coupled to the plurality of first traces, and wherein the plurality of power connection points are coupled to the plurality of second traces; a multiplexer in the substrate; a microcontroller in the substrate, wherein the microcontroller is coupled to the multiplexer, the plurality of connection points, and the plurality of heaters; and a plurality of heated surfaces in the plurality of zones of the substrate of the RGA interposer, wherein the plurality of heated surfaces are thermally coupled to the plurality of heaters, the plurality of first solder balls, and the plurality of first conductive pads, wherein the plurality of heated surfaces have a first temperature that is lower than a second temperature of the plurality of heated surfaces, and wherein the second temperature of the plurality of heated surfaces reflows the plurality of first solder balls to couple the substrate of the RGA interposer to the first substrate of the semiconductor package.

Example 20 is a method of forming a semiconductor packaged system, comprising: disposing a die on a first substrate, wherein the first substrate has a top surface and a bottom surface that is opposite to the top surface; stacking a heatsink over the die and the first substrate, wherein the heatsink is coupled to the top surface of the first substrate; coupling a plurality of first solder balls to the bottom surface of the first substrate, wherein the heatsink, the die, the substrate, and the plurality of first solder balls are stacked on top of each other, respectively, to form a semiconductor package; disposing a RGA interposer on a package substrate, wherein the RGA interposer includes a substrate and a plurality of heaters, and wherein the substrate of the RGA interposer is coupled to the package substrate by a plurality of second solder balls; disposing the semiconductor package onto the RGA interposer; and reflowing, by the plurality of heaters in the RGA interposer, the plurality of first solder balls on the substrate of the RGA interposer to the first substrate of the semiconductor package.

In example 21, the subject matter of example 20 can optionally include that the RGA interposer further comprises: disposing a plurality of zones in the substrate; disposing a plurality of heaters in the plurality of zones of the substrate, wherein the plurality of heaters include a plurality of first traces, a plurality of second traces, and a plurality of via filament interconnects; disposing a second layer over a second layer in the substrate, wherein the first layer includes the plurality of first traces, wherein the second layer includes the plurality of second traces; disposing the plurality of first traces parallel to each other, and the plurality of second traces parallel to each other; disposing a plurality of vias in the substrate, wherein the plurality of vias have a z-height that is greater than a z-height of the plurality of heaters; and intersecting, at each of the plurality of zones, the parallel plurality of first traces orthogonal to the parallel plurality of second traces to form a grid pattern, wherein the grid pattern includes a pattern of squares formed by intersecting the plurality of first traces and the second traces, wherein the pattern of squares has the plurality of first traces intersect the plurality of second traces substantially at right angles.

In example 22, the subject matter of examples 20-21 can optionally include that each of the plurality of via filament interconnects is located at each right angle of the grid pattern, wherein each of the via filament interconnects has a top end and a bottom end that is opposite to the top end, and wherein each of the via filament interconnects is coupled to one of the plurality of first traces on the top end and one of the plurality of second traces on the bottom end.

In example 23, the subject matter of examples 20-22 can optionally include that the substrate has a top surface and a bottom surface that is opposite to the top surface, wherein the plurality of vias extend vertically substantially from the bottom surface to the top surface, wherein the pattern of squares surround one or more of the plurality of vias, wherein the plurality of vias are adjacent to the plurality of heaters, and wherein the plurality of heaters are resistive heaters.

In example 24, the subject matter of examples 20-23 can optionally include that the plurality of first and second traces are wavy lines, wherein the plurality of first traces are coupled to a ground source, wherein the plurality of second traces are coupled to a power source, wherein each of the plurality of vias has a top end and a bottom end that is opposite to the top end, wherein the top end is substantially planar to the top surface of the substrate, and wherein the bottom end is substantially planar to the bottom surface of the substrate.

In example 25, the subject matter of examples 20-24 can optionally include that the RGA interposer further comprises: disposing a plurality of first conductive pads on the top surface of the substrate, wherein each of the plurality of first conductive pads is coupled to the top end of each of the plurality of vias, and wherein the plurality of first solder balls are on the plurality of first conductive pads; disposing a plurality of second conductive pads on the bottom surface of the substrate, wherein each of the plurality of second conductive pads is coupled to the bottom end of each of the plurality of vias; disposing a plurality of connection points coupled to the plurality of first and second traces of the plurality of heater traces, wherein the plurality of connection points include a plurality of ground connection points and a plurality of power connections points, wherein the plurality of ground connection points are coupled to the plurality of first traces, and wherein the plurality of power connection points are coupled to the plurality of second traces; disposing a multiplexer and a microcontroller in the substrate, wherein the microcontroller is coupled to the multiplexer, the plurality of connection points, and the plurality of heaters; and disposing a plurality of heated surfaces in the plurality of zones of the substrate of the RGA interposer, wherein the plurality of heated surfaces are thermally coupled to the plurality of heaters, the plurality of first solder balls, and the plurality of first conductive pads, wherein the plurality of heated surfaces have a first temperature that is lower than a second temperature of the plurality of heated surfaces, and wherein the second temperature of the plurality of heated surfaces reflows the plurality of first solder balls to couple the substrate of the RGA interposer to the first substrate of the semiconductor package.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A reflowable grid array (RGA) interposer, comprising:
a substrate having a plurality of zones;
a plurality of heaters in the plurality of zones of the substrate, wherein the plurality of heaters include a plurality of first traces, a plurality of second traces, and a plurality of via filament interconnects; and
a plurality of vias in the substrate, wherein the plurality of vias have a z-height that is greater than a z-height of the plurality of heaters, and wherein each of the plurality of zones has a grid pattern.

2. The RGA interposer of claim 1, further comprising:
a first layer in the substrate, wherein the first layer includes the plurality of first traces; and
a second layer in the substrate, wherein the second layer includes the plurality of second traces, and wherein the second layer is over the first layer.

3. The RGA interposer of claim 2, wherein the grid pattern includes the plurality of first traces and the plurality of second traces, wherein each of the plurality of first traces in the grid pattern are parallel to each other, wherein each of the plurality of second traces in the grid pattern are parallel to each other, wherein the parallel plurality of first traces of the grid pattern are orthogonal to the parallel plurality of second traces of the grid pattern to form a pattern of squares, and wherein the pattern of squares has the plurality of first traces intersect the plurality of second traces substantially at right angles.

4. The RGA interposer of claim 3, wherein each of the plurality of via filament interconnects is located at each right angle of the grid pattern, wherein each of the via filament interconnects has a top end and a bottom end that is opposite to the top end, and wherein each of the via filament interconnects is coupled to one of the plurality of first traces on the top end and one of the plurality of second traces on the bottom end.

5. The RGA interposer of claim 3, wherein the substrate has a top surface and a bottom surface that is opposite to the top surface, wherein the plurality of vias extend vertically substantially from the bottom surface to the top surface, wherein the pattern of squares surround one or more of the plurality of vias, wherein the plurality of vias are adjacent to the plurality of heaters, and wherein the plurality of heaters are resistive heaters.

6. The RGA interposer of claim 5, wherein the plurality of first and second traces are wavy lines, wherein the plurality of first traces are coupled to a ground source, wherein the plurality of second traces are coupled to a power source, wherein each of the plurality of vias has a top end and a bottom end that is opposite to the top end, wherein the top end is substantially planar to the top surface of the substrate, and wherein the bottom end is substantially planar to the bottom surface of the substrate.

7. The RGA interposer of claim 6, further comprising:
a plurality of first conductive pads on the top surface of the substrate, wherein each of the plurality of first conductive pads is coupled to the top end of each of the plurality of vias;
a plurality of second conductive pads on the bottom surface of the substrate, wherein each of the plurality of second conductive pads is coupled to the bottom end of each of the plurality of vias;
a plurality of connection points coupled to the plurality of first and second traces of the plurality of heater traces, wherein the plurality of connection points include a plurality of ground connection points and a plurality of power connections points, wherein the plurality of ground connection points are coupled to the plurality of first traces, and wherein the plurality of power connection points are coupled to the plurality of second traces;
a multiplexer in the substrate; and
a microcontroller in the substrate, wherein the microcontroller is coupled to the multiplexer, the plurality of connection points, and the plurality of heaters.

8. The RGA interposer of claim 7, further comprising:
a plurality of solder balls on the plurality of first conductive pads on the top surface of the substrate, wherein the plurality of solder balls couples the substrate to a second substrate; and
a plurality of heated surfaces in the plurality of zones of the substrate, wherein the plurality of heated surfaces are thermally coupled to the plurality of heaters, the plurality of solder balls, and the plurality of first conductive pads, and wherein the plurality of heated surfaces have a first temperature that is lower than a second temperature of the plurality of heated surfaces.

9. The RGA interposer of claim 8, wherein the second temperature of the plurality of heated surfaces reflows the plurality of solder balls to couple the substrate to the second substrate.

10. A semiconductor packaging system, comprising:
a RGA interposer on a package substrate; and
a semiconductor package on the RGA interposer, wherein the RGA interposer includes
a substrate having a plurality of zones;
a plurality of heaters in the plurality of zones of the substrate, wherein the plurality of heaters include a plurality of first traces, a plurality of second traces, and a plurality of via filament interconnects; and
a plurality of vias in the substrate, wherein the plurality of vias have a z-height that is greater than a z-height of the plurality of heaters, and wherein each of the plurality of zones has a grid pattern.

11. The semiconductor packaging system of claim 10, wherein the semiconductor package further comprises:
a die on a first substrate;
a heatsink over the die, wherein the heatsink is on the first substrate; and
a plurality of first solder balls on a bottom surface of the first substrate, wherein the plurality of first solder balls couples the bottom surface of the first substrate of the semiconductor package to the top surface of the substrate of the RGA interposer.

12. The semiconductor packaging system of claim 11, wherein the first substrate includes a ball grid array (BGA) or a land grid array (LGA), and wherein the die includes an integrated circuit (IC), a central processing unit (CPU), a microprocessor, a platform controller hub (PCH), a memory, or a field-programmable gate array (FPGA).

13. The semiconductor packaging system of claim 11, further comprising:
a first layer in the substrate, wherein the first layer includes the plurality of first traces; and
a second layer in the substrate, wherein the second layer includes the plurality of second traces, and wherein the second layer is over the first layer.

14. The semiconductor packaging system of claim 13, wherein the grid pattern includes the plurality of first traces and the plurality of second traces, wherein each of the plurality of first traces in the grid pattern are parallel to each other, wherein each of the plurality of second traces in the grid pattern are parallel to each other, wherein the parallel plurality of first traces of the grid pattern are orthogonal to the parallel plurality of second traces of the grid pattern to form a pattern of squares, and wherein the pattern of squares has the plurality of first traces intersect the plurality of second traces substantially at right angles.

15. The semiconductor packaging system of claim 14, wherein each of the plurality of via filament interconnects is located at each right angle of the grid pattern, wherein each of the via filament interconnects has a top end and a bottom end that is opposite to the top end, and wherein each of the via filament interconnects is coupled to one of the plurality of first traces on the top end and one of the plurality of second traces on the bottom end.

16. The semiconductor packaging system of claim 14, wherein the substrate has a top surface and a bottom surface that is opposite to the top surface, wherein the plurality of vias extend vertically substantially from the bottom surface to the top surface, wherein the pattern of squares surround one or more of the plurality of vias, wherein the plurality of vias are adjacent to the plurality of heaters, and wherein the plurality of heaters are resistive heaters.

17. The semiconductor packaging system of claim 16, wherein the plurality of first and second traces are wavy lines, wherein the plurality of first traces are coupled to a ground source, wherein the plurality of second traces are coupled to a power source, wherein each of the plurality of vias has a top end and a bottom end that is opposite to the top end, wherein the top end is substantially planar to the top surface of the substrate, and wherein the bottom end is substantially planar to the bottom surface of the substrate.

18. The semiconductor packaging system of claim 17, further comprising:
a plurality of first conductive pads on the top surface of the substrate, wherein each of the plurality of first conductive pads is coupled to the top end of each of the plurality of vias, and wherein the plurality of first solder balls are on the plurality of first conductive pads;
a plurality of second conductive pads on the bottom surface of the substrate, wherein each of the plurality of second conductive pads is coupled to the bottom end of each of the plurality of vias;
a plurality of connection points coupled to the plurality of first and second traces of the plurality of heater traces, wherein the plurality of connection points include a plurality of ground connection points and a plurality of power connections points, wherein the plurality of ground connection points are coupled to the plurality of first traces, and wherein the plurality of power connection points are coupled to the plurality of second traces;
a multiplexer in the substrate;
a microcontroller in the substrate, wherein the microcontroller is coupled to the multiplexer, the plurality of connection points, and the plurality of heaters; and
a plurality of heated surfaces in the plurality of zones of the substrate of the RGA interposer, wherein the plurality of heated surfaces are thermally coupled to the plurality of heaters, the plurality of first solder balls, and the plurality of first conductive pads, wherein the plurality of heated surfaces have a first temperature that is lower than a second temperature of the plurality of heated surfaces, and wherein the second temperature of the plurality of heated surfaces reflows the plurality of first solder balls to couple the substrate of the RGA interposer to the first substrate of the semiconductor package.

19. The semiconductor packaging system of claim 10, further comprising a plurality of second solder balls coupled to the bottom surface of the RGA interposer and a top surface of the package substrate.

20. A method of forming a semiconductor packaged system, comprising:
disposing a die on a first substrate, wherein the first substrate has a top surface and a bottom surface that is opposite to the top surface;
stacking a heatsink over the die and the first substrate, wherein the heatsink is coupled to the top surface of the first substrate;
coupling a plurality of first solder balls to the bottom surface of the first substrate, wherein the heatsink, the die, the substrate, and the plurality of first solder balls are stacked on top of each other, respectively, to form a semiconductor package;
disposing a RGA interposer on a package substrate, wherein the RGA interposer includes a substrate and a plurality of heaters, and wherein the substrate of the RGA interposer is coupled to the package substrate by a plurality of second solder balls, wherein forming the RGA interposer comprises:
disposing a plurality of zones in the substrate;
disposing a plurality of heaters in the plurality of zones of the substrate, wherein the plurality of heaters include a plurality of first traces, a plurality of second traces, and a plurality of via filament interconnects;
disposing a second layer over a second layer in the substrate, wherein the first layer includes the plurality of first traces, wherein the second layer includes the plurality of second traces;
disposing the plurality of first traces parallel to each other, and the plurality of second traces parallel to each other;
disposing a plurality of vias in the substrate, wherein the plurality of vias have a z-height that is greater than a z-height of the plurality of heaters; and
intersecting, at each of the plurality of zones, the parallel plurality of first traces orthogonal to the parallel plurality of second traces to form a grid pattern, wherein the grid pattern includes a pattern of squares formed by intersecting the plurality of first traces and the second traces, wherein the pattern of squares has the plurality of first traces intersect the plurality of second traces substantially at right angles;

disposing the semiconductor package onto the RGA interposer; and reflowing, by the plurality of heaters in the RGA interposer, the plurality of first solder balls on the substrate of the RGA interposer to the first substrate of the semiconductor package.

21. The method of claim 20, wherein each of the plurality of via filament interconnects is located at each right angle of the grid pattern, wherein each of the via filament interconnects has a top end and a bottom end that is opposite to the top end, and wherein each of the via filament interconnects is coupled to one of the plurality of first traces on the top end and one of the plurality of second traces on the bottom end.

22. The method of claim 21, wherein the substrate has a top surface and a bottom surface that is opposite to the top surface, wherein the plurality of vias extend vertically substantially from the bottom surface to the top surface, wherein the pattern of squares surround one or more of the plurality of vias, wherein the plurality of vias are adjacent to the plurality of heaters, and wherein the plurality of heaters are resistive heaters.

23. The method of claim 20, wherein the plurality of first and second traces are wavy lines, wherein the plurality of first traces are coupled to a ground source, wherein the plurality of second traces are coupled to a power source, wherein each of the plurality of vias has a top end and a bottom end that is opposite to the top end, wherein the top end is substantially planar to the top surface of the substrate, and wherein the bottom end is substantially planar to the bottom surface of the substrate.

24. The method of claim 20, wherein forming the RGA interposer further comprises:

disposing a plurality of first conductive pads on the top surface of the substrate, wherein each of the plurality of first conductive pads is coupled to the top end of each of the plurality of vias, and wherein the plurality of first solder balls are on the plurality of first conductive pads;

disposing a plurality of second conductive pads on the bottom surface of the substrate, wherein each of the plurality of second conductive pads is coupled to the bottom end of each of the plurality of vias;

disposing a plurality of connection points coupled to the plurality of first and second traces of the plurality of heater traces, wherein the plurality of connection points include a plurality of ground connection points and a plurality of power connections points, wherein the plurality of ground connection points are coupled to the plurality of first traces, and wherein the plurality of power connection points are coupled to the plurality of second traces;

disposing a multiplexer and a microcontroller in the substrate, wherein the microcontroller is coupled to the multiplexer, the plurality of connection points, and the plurality of heaters; and disposing a plurality of heated surfaces in the plurality of zones of the substrate of the RGA interposer, wherein the plurality of heated surfaces are thermally coupled to the plurality of heaters, the plurality of first solder balls, and the plurality of first conductive pads, wherein the plurality of heated surfaces have a first temperature that is lower than a second temperature of the plurality of heated surfaces, and wherein the second temperature of the plurality of heated surfaces reflows the plurality of first solder balls to couple the substrate of the RGA interposer to the first substrate of the semiconductor package.

* * * * *